United States Patent [19]
Wagner et al.

[11] Patent Number: 6,158,033
[45] Date of Patent: Dec. 5, 2000

[54] MULTIPLE INPUT SIGNATURE TESTING & DIAGNOSIS FOR EMBEDDED BLOCKS IN INTEGRATED CIRCUITS

[75] Inventors: Kenneth D. Wagner, Sunnyvale; Mehran Amerian, Campbell, both of Calif.

[73] Assignee: S3 Incorporated, Santa Clara, Calif.

[21] Appl. No.: 09/075,350

[22] Filed: May 8, 1998

[51] Int. Cl.$^7$ .................................................. G01R 31/28
[52] U.S. Cl. ........................... 714/726; 714/30; 714/732; 714/733
[58] Field of Search ................................. 714/725, 726, 714/732, 733, 728, 736, 739, 724, 30; 395/500.05

[56] References Cited

U.S. PATENT DOCUMENTS

| | | | |
|---|---|---|---|
| 4,513,418 | 4/1985 | Bardell, Jr. et al. ..................... | 714/726 |
| 4,519,078 | 5/1985 | Komonytsky ............................ | 714/728 |
| 5,583,786 | 12/1996 | Needham ............................ | 395/500.05 |
| 5,983,380 | 11/1999 | Motika et al. ........................... | 714/733 |

OTHER PUBLICATIONS

Bernd Konemann, et al., "Built–In Test for Complex Digital Integrated Circuits", IEEE Journal of Solid State Circuits, vol. SC–15, No. 3, Jun. 1980.

Edward J. McCluskey, "Logic Design Principles—With Emphasis on Testable Semicustom Circuits" 1986.

*Primary Examiner*—Emmanuel L. Moise
*Attorney, Agent, or Firm*—Fenwick & West LLP

[57] ABSTRACT

An integrated circuit includes a first circuit module for generating a plurality of digital signals and a second circuit module for receiving the digital signals. A multiple input signature module receives the digital signals that are received by the second circuit module. The signature module generates and stores a signature value which is indicative of data values of the digital signals over a plurality of cycles. The signature module operates in response to control circuitry, which is responsive to a test signal, to cause the values indicative of the digital signals to be stored to the multiple input signature module, each time that valid signal values are received by the second circuit module. The multiple input signature module may be used for diagnostics by capturing data at a single, predetermined cycle. The module may be initialized to a predetermined value to ensure the signature value or, the single value captured, accurately reflects the data value of the digital signals. The control circuitry is further responsive to a signature data signal for causing data stored in the multiple input signature module to be provided on at least a first output pin of the integrated circuit. The integrated circuit includes scan circuitry and the signature data signal causes the multiple input signature module to form a portion of the scan circuitry.

14 Claims, 5 Drawing Sheets

MULTIPLE INPUT SIGNATURE TESTING & DIAGNOSIS FOR EMBEDDED BLOCKS IN INTEGRATED CIRCUITS

FIELD OF THE INVENTION

This invention relates generally to the field of testing of integrated circuits and more particularly to testing and/or diagnosis of embedded blocks in integrated circuits.

BACKGROUND OF THE INVENTION

Increases in density of integrated circuits impose increasing challenges on the testing of such circuits. A significant factor contributing to the difficulty in testing dense integrated circuits (chips) is the inaccessibility of particular circuits within the chip from the chip pins. The lack of direct access to many circuits requires development of test strategies to indirectly access such circuits. A known technique for accessing circuitry embedded within a chip is by use of scan chains within the chip. Aspects of scan chains and scan testing are described in "Logic Design Principles" by E. J. McCluskey 1986, Prentice Hall, N.J.

One of the drawbacks to employing scan chains for testing embedded circuitry is that scan data serialization leads to low bandwidth testing and prevents the application of test vectors and measurement of circuit response on a per cycle basis. For example in scan-based testing, the state data desired to start an operation must be scanned into position. The desired operation must be performed and then the data in the scan chain must be scanned out of the chip. Such a procedure is useful, but can be very time consuming if multiple operations need to be tested. What is needed therefore is an improved testing mechanism that facilitates testing of embedded circuits in an integrated circuit, allowing new test data to be applied and response measured every clock cycle.

BRIEF SUMMARY OF THE INVENTION

In a principal aspect, the present invention improves testability of an integrated circuit by providing for capture and compression of data, internal to the integrated circuit, for a plurality of cycles. The data can then be provided to outputs of the integrated circuit for analysis. Signals transmitted by a first logic block contained within the integrated circuit that are received by a second logic block contained within the integrated circuit are also received by a multiple input signature module concurrently when test mode is active. In response to a valid (write) signal indicating data values are valid for use in the second logic block, the multiple input signature module captures data values contained in the signals generated by the first logic block. The multiple input signature module generates a signature value indicative of the cumulative data values over many cycles. The multiple input signature module provides the signature value to outputs of the integrated circuit in response to a data output mode. This signature is verified at least once at the end of the test sequence or more frequently for diagnosis.

In accordance with a further aspect of the invention, the integrated circuit includes a scan chain. The data output mode causes the signature module to form a portion of the scan chain and the signature value is provided to outputs of the integrated circuit as a portion of a serial data stream generated by the scan chain for verification of the signature.

A significant advantage of embodiments employing the principles of the present invention is rapid, improved testability. Data values generated by a first logic block may be captured and stored for multiple cycles and then provided for analysis. This facilitates testing of the first logic block. For certain preferred embodiments, the second logic block takes the form of a memory embedded within the integrated circuit. In such an embodiment, testing of the first logic block, which stores data to the embedded memory is greatly facilitated by use of the principles described herein. In such embodiments, the multiple input signature module captures valid data and addresses generated by the first logic block over a plurality of cycles. The first logic blocks may be stimulated by functional test vectors or other forms of built-in vector generation. These vectors may be applied at the circuit rated performance. These values are compressed into a signature value which can then be provided on one or more outputs of the chip (such as by use of scan chains) for analysis of the addresses and data generated by the first logic block.

In accordance with a further aspect of the invention, the multiple input signature module may be initialized to a predetermined value. The multiple input signature module may then be used to capture signals transmitted by the first logic block to the second logic block at a predetermined cycle. The multiple input signature module is therefore used to capture data without generating a signature value. This feature may be used to particular advantage in diagnostic modes to capture data values at a particular cycle.

These and other features and advantages of the present invention may be better understood by considering the following detailed description of a preferred embodiment of the invention. In the course of this description, reference will frequently be made to the attached drawings.

DETAILED DESCRIPTION OF THE PREFERRED EMBODIMENTS

Figure 1:
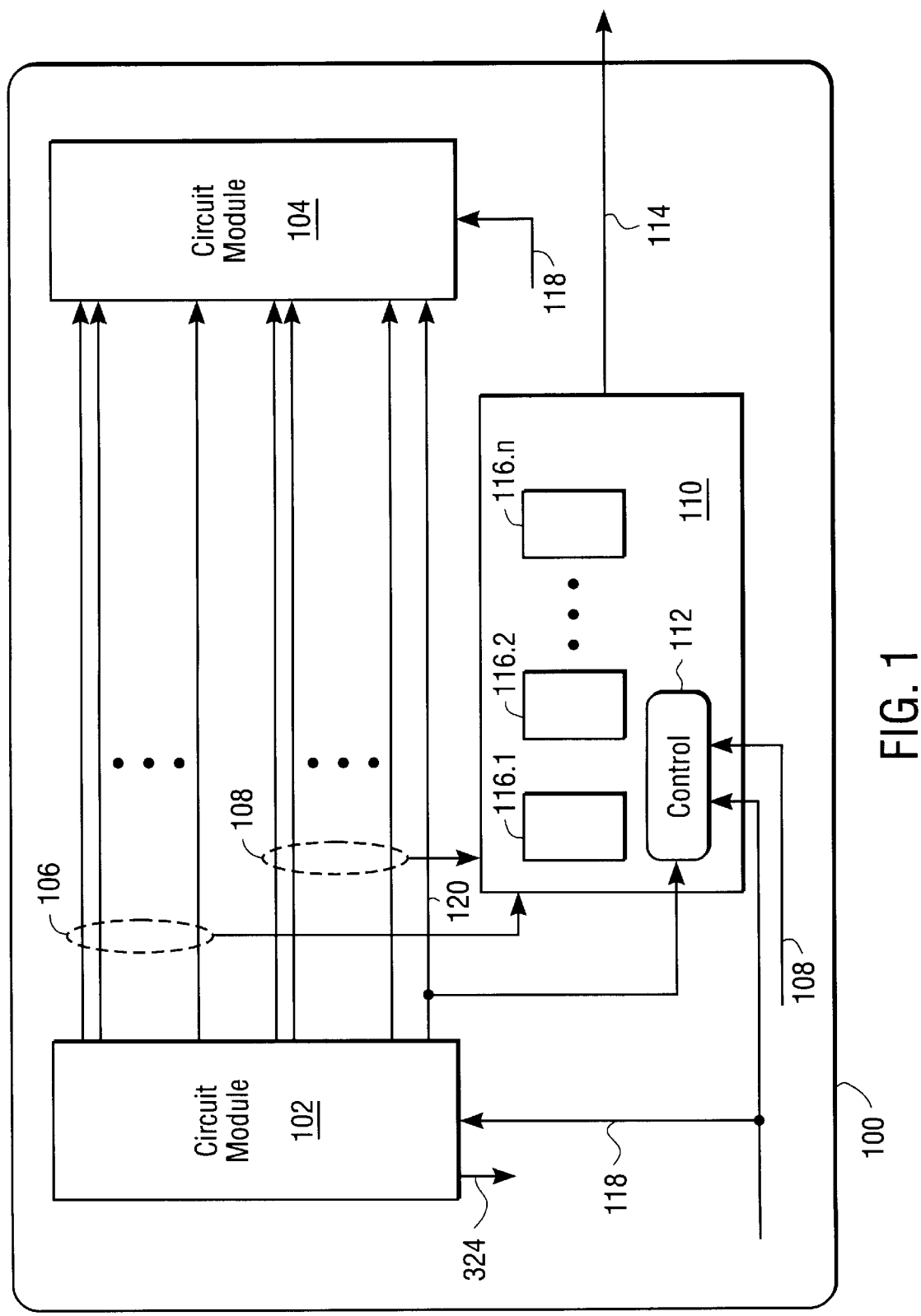
FIG. 1 is a block diagram of a preferred embodiment employing the principles of the present invention.

In FIG. 1, an integrated circuit chip 100, includes a first circuit module 102 and a second circuit module 104. Circuit module 102 preferably includes a plurality of digital circuits that generate data signals 106 and address and other control signals 108. Data signals 106 and address/control signals 108 are received by circuit module 104. Circuit modules 102 and 104 may take a variety of forms to perform a variety of functions. For example, in a preferred embodiment circuit module 102 takes the form of a graphics controller that generates data signals 106 and address and control signals 108. Circuit module 104 in such an embodiment takes the form of a Dynamic Random Access Memory (DRAM) that stores data 106 at addresses indicated by address/control signals 108.

Data signals 106 and address/control signals 108 are each received by a multiple input signature module 110, which operates in accordance with control signals generated by control module 112. Multiple input signature module 110 advantageously operates in accordance with the principles of the present invention to capture data values transmitted via signals 106 and 108, to compress such data values, and to provide a signature value indicative of such data values to an output pin (or output structure) of chip 100 by way of signal line 114. In an alternative embodiment, the signature value provided by an equivalent multiple input signature module 110 is provided in parallel to a plurality of pins on chip 100. Circuit module 102 may also generate mask bits 324 which perform a function described in greater detail herein.

Multiple input signature module 110 includes a plurality of storage elements 116 (shown individually as 116.1, 116.2 . . . , 116.n). In an exemplary embodiment, multiple input signature module 110 includes 145 storage elements 116, corresponding to 128 data signals 106, and 17 address signals, part of address/control signals 108.

Figure 2:
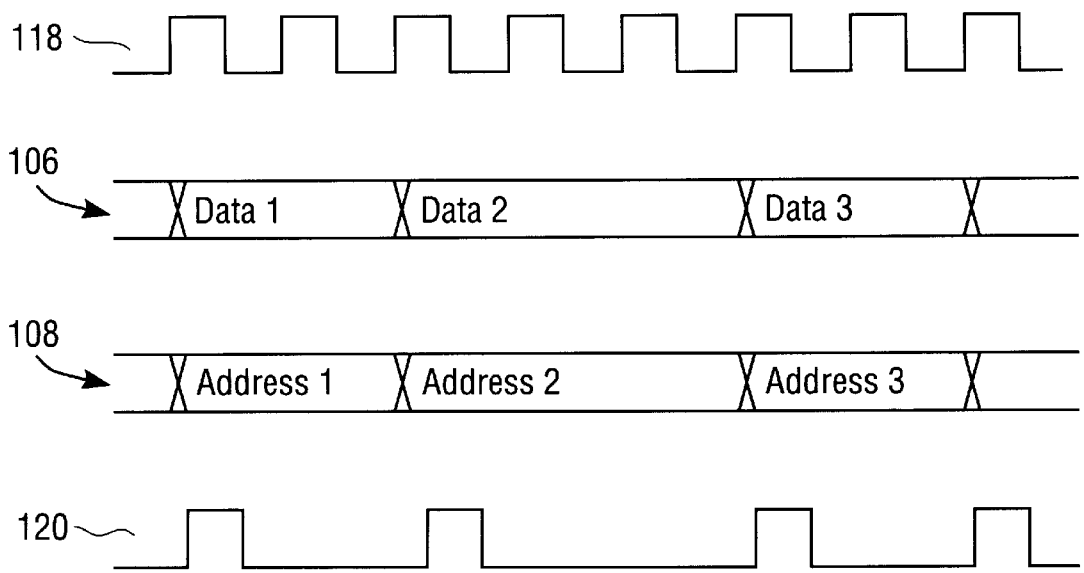
FIG. 2 is a timing diagram illustrating certain operations performed by the embodiment shown in FIG. 1.

Multiple input signature module 110 preferably captures data values transmitted by way of signal lines 106 and 108 in a manner shown in the timing diagram of FIG. 2. Circuit modules 102 and 104 are preferably synchronous circuits whose interaction (interfaces) operate in accordance with a clock signal 118. Data values 106 and address/control values 108 are stored in multiple input signature module 110 and in circuit module 104 upon each rising edge of write enable signal 120. Data on signal lines 106 is written to storage locations in circuit module 104 at addresses designated by address/control lines 108 in accordance with write enable signal 120. Whenever write enable signal 120 causes data values on signal lines 106 to be written to circuit module 104 at locations specified by address values on address/control lines 108, the same values indicated by data line 106 and address/control lines 108 are stored to multiple input signature module 110 by virtue of write enable signal 120. Multiple input signature module 110 advantageously operates to create a unique incremental signature value in response to the multiple data values stored to multiple input signature module 110 by way of write enable signal 120.

Figure 3:
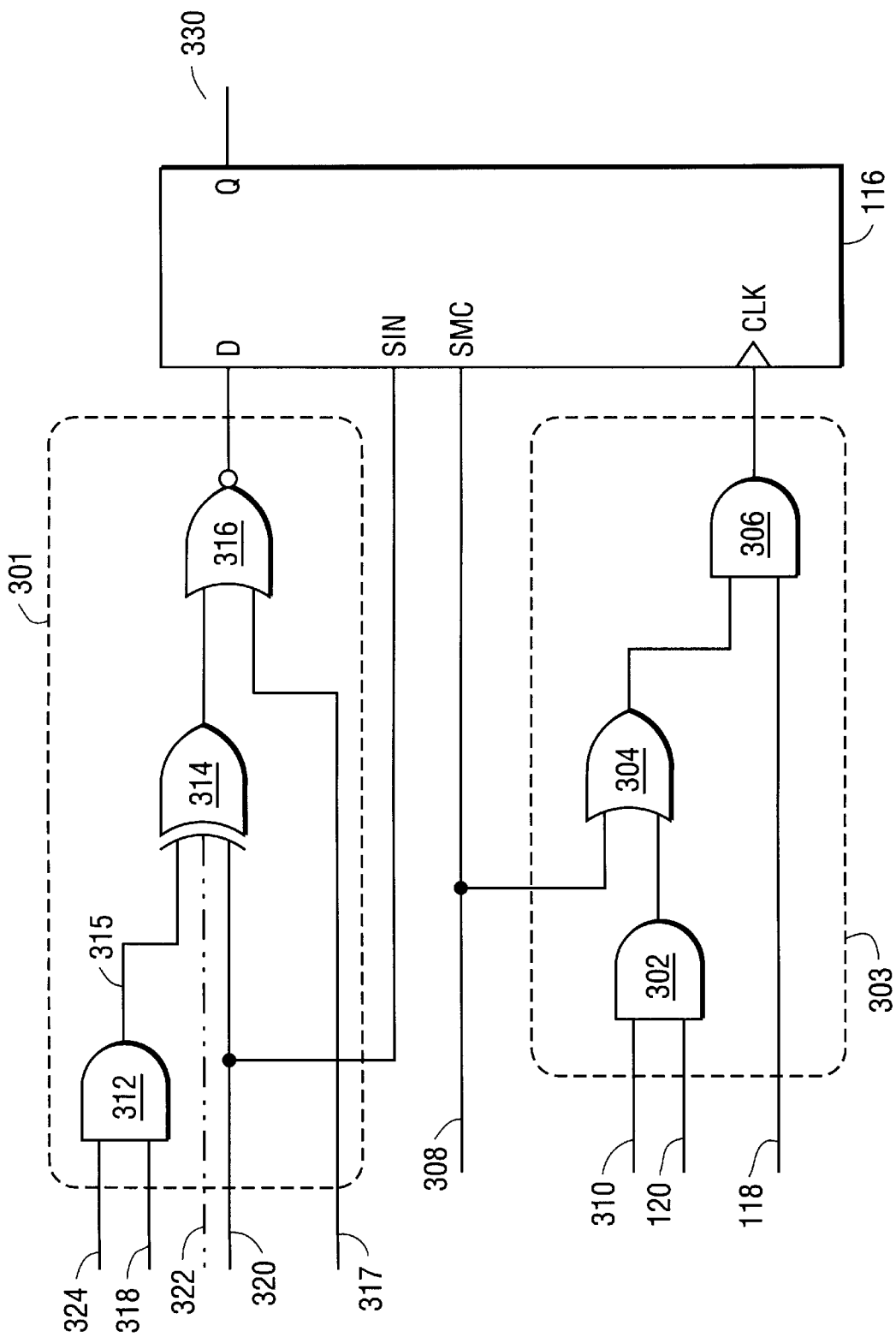
FIG. 3 is a block diagram showing further details of the multiple-input signature module of FIG. 1.

FIG. 3 illustrates further details of one stage of multiple input signature module 110. Each stage of multiple input signature module 110 comprises a storage element 116 which in a preferred embodiment takes the form of a D-type flip-flop. Associated with each storage element is signature generation circuitry 301 and clock control circuitry 303. The signature generation circuitry 301 generates a portion of the signature value for storage in the associated storage element 116. The clock control circuitry 303 controls when data is stored to each storage element 116 of the module 110. Storage element 116 preferably includes a scan input (SIN), and a scan enable input (SMC) in addition to a data input (D), data output (Q) 330, and a clock input (CLK), to allow the storage element 116 to form a portion of a scan chain. Details of scan chains are described in "Logic Design Principles" by E. J. McClusky, 1986, Prentice Hall, N.J. Assertion of the clock signal CLK causes data at the data input or scan input to be provided at the data output.

Clock input (CLK) is generated by way of logic elements 302, 304, and 306. CLK signal 118 is provided to the CLK input when scan mode is enabled by way of scan-enable signal 308, or if multiple input signature module 110 is enabled by way of MISR ON signal 310 and write enable signal 120 is asserted. Thus data is clocked into storage element 110 under control of CLK signal, either during scan mode or when the multiple input signature module is enabled and the write enable signal is asserted.

Signature generation circuitry 301 generates a portion of the signature value by way of XOR gate 314 which receives a masked present stage data bit 315, a prior stage data bit 320 and (for selected stages) a tap bit 322. Masked present stage data bit 315 is derived from present stage data bit 318 which corresponds to one of the signal lines 106 or 108. Prior stage data bit 320 corresponds to the output bit 330 of the previous stage. Storage element bits of module 110 are connected in a shift register for scan purposes, bit 330 of a stage such as 116.1 connected to bit 320 of the next stage 116.2.

Masked present stage data bit 315 is generated by AND gate 312 which masks present stage data bit 318 when mask bit 324 is zero. Mask bit 324 and AND gate 312 operate to force present stage data bit 318 to a zero value when the signal line 106 or 108 corresponding to bit 318 is not being driven by circuit module 102. For example, if circuit module 104 is a DRAM, certain write operations performed by circuit module 102 may result in only some bits of data lines 106 being written to a location in circuit module 104. In such an instance, the data value on the signal lines 106 and 108 not being written to circuit module 104 may not be known. Mask bit 324 and AND gate 312 advantageously operate to force a known present stage data value to be generated to XOR gate 314. The exact value, be it zero or one, is unimportant so long as it is predetermined and the signature value remains deterministic (predictable) and not affected by unknown ("x") data.

Figure 5:
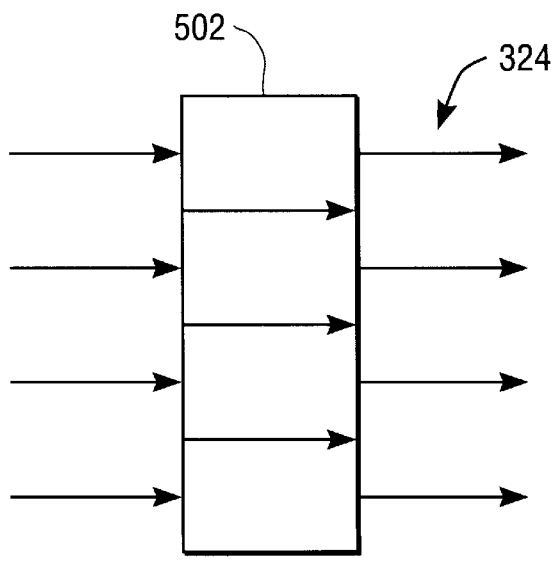
FIG. 5 is a block diagram illustrating further details of FIGS. 3 and 4.

Mask bit 324 is generated in a manner shown in further detail in FIG. 5. Register 502, which in a preferred embodiment is contained in circuit module 102, contains a plurality of mask bits, with each mask bit corresponding to one or more bits of signal lines 106. In a preferred embodiment where circuit module 104 corresponds to a DRAM, register 502 comprises 16 bits, with one mask bit of register 502 corresponding to a byte (8 bits) of signal lines 106. In such an embodiment, DRAM 104 is byte addressable, to allow read and write operations to be performed on a byte basis. Therefore only one mask bit per byte is required. Mask bits are stored in register 502 to generate mask bits 324. During any particular cycle when circuit module 102 is writing data to circuit module 104, it sets bits in register 502 corresponding to the bytes of data on signal lines 106 that are being written to circuit module 104. The other mask bits are set to the masking value causing the corresponding present stage data bytes to be masked to a predetermined value.

Tap bit 322 corresponds to a selected stage output bit 330. In a preferred embodiment, signature module 110, which comprises 145 stages, is implemented as five sub-modules of 29 stages each. The five sub-modules are interlinked by way of the scan logic described herein. If the stages are numbered sequentially from 0 to 144 then stages 0, 29, 58, 87 and 116 each receive 3 XORed tap bits. Specifically, stage zero receives tap bits 322 (XORed) that correspond to bit 330 of stages 0, 1 and 28. Stage 29 receives 3 tap bits, 330 that correspond to stages 29, 30 and 57. Stage 58 receives 3 tap bits 330 that correspond to stages 58, 59 and 86. Stage 87 receives 3 tap bits 330 that correspond to bits 330 of stages 87, 88 and 115. Stage 116 receives 3 tap bits 330 that corresponds to bits 116, 117 and 144. Principles of signature value generation are described in "Logic Design Principles" by E. J. McClusky 1986, Prentice Hall, N.J.

Figure 4:
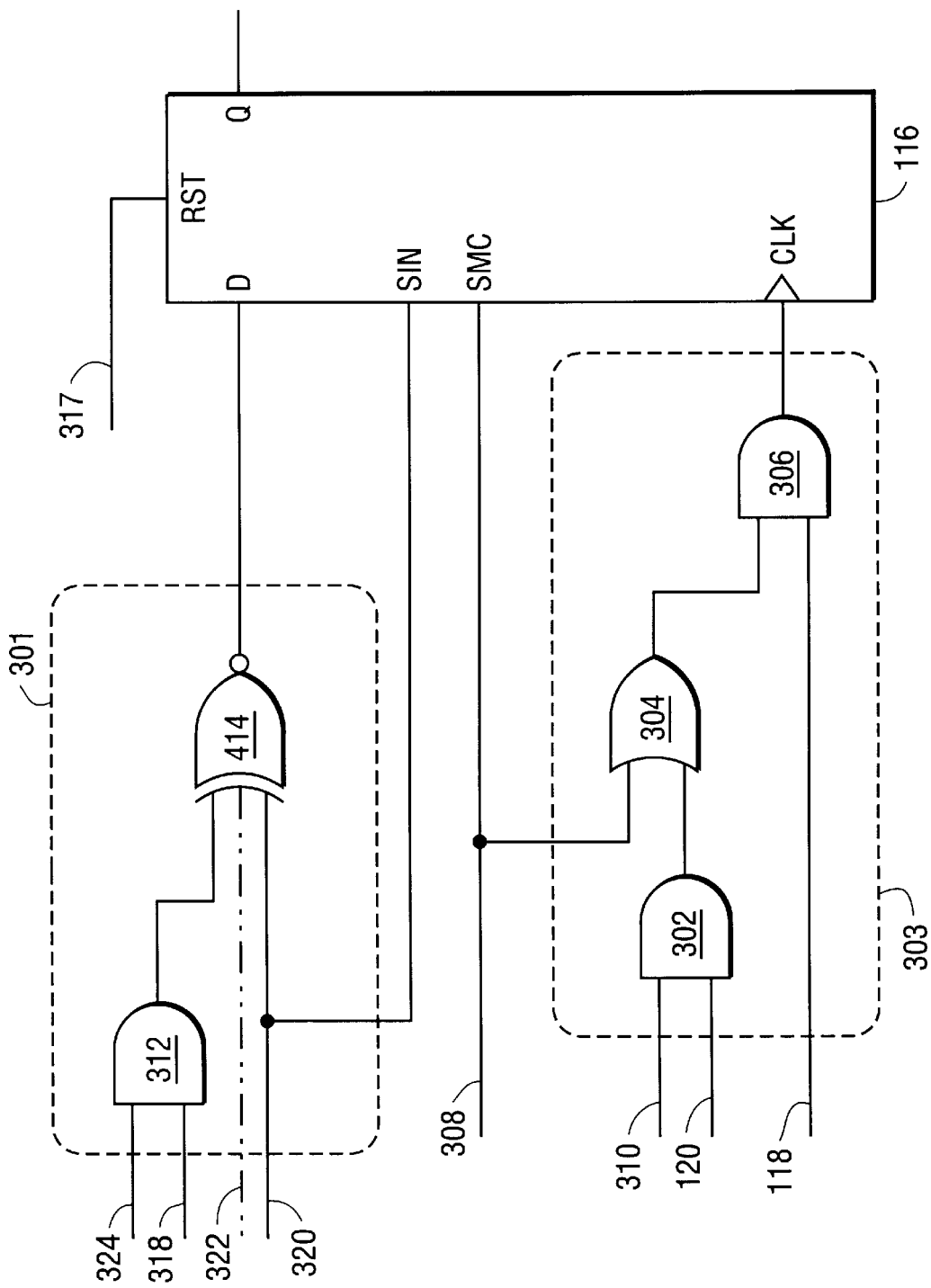
FIG. 4 is a block diagram showing an alternative embodiment of the multiple-input signature module of FIG. 1.

NOR gate 316 operates in response to DIAG-ON signal 317 to reset storage element 116. The exact manner in which the storage elements 116 are reset is unimportant so long as they are set to a known value. FIG. 4 of the drawings shows an alternative embodiment in which storage elements are reset to a known value by way of a reset input over the storage elements. FIG. 4 is the same in all other respects as FIG. 3, with the exception that XOR gate 314 is changed to an XNOR gate 414 to account for the inverting function provided by NOR gate 316. It is important that storage elements 116 be initialized to a known value to ensure the integrity of the signature value generated by signature module 110. The module 110 may be used during a diagnostic mode to capture data at a single cycle, rather than capturing data over multiple cycles. During such a diagnostic mode, the signature register is initialized at the cycle previous to the cycle being diagnosed, then one cycle is run to capture data in the cycle under test, then scan is used to examine the data.

Figure 6:
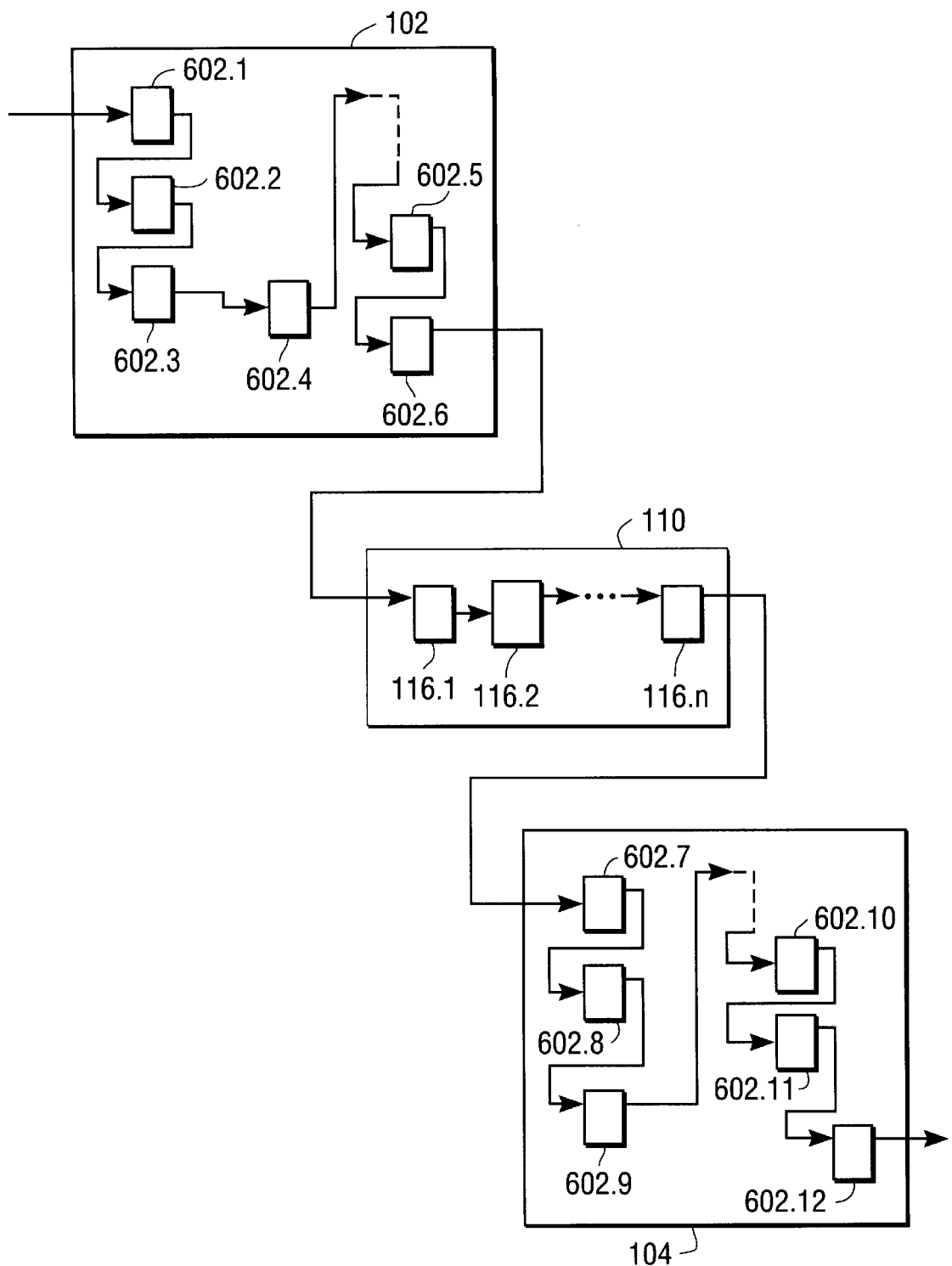
FIG. 6 is a block diagram showing a scan chain which includes the multiple-input signature module of FIG. 1.

The signature value generated and stored by the signature module 110 is preferably provided to outputs of the chip 100 under control of scan enable 308 which causes the storage elements 116 of the signature module 110 to form a portion of a scan chain. An example of such a scan chain is shown in FIG. 6. A plurality of storage elements 602 (shown individually 602.1, 602.2 . . . , 602.12) contained in circuit modules 102 and 104 are interlinked such that each storage element (typically a D-type flip-flop) receives a scan input which is the data output from another storage element. Included within the scan chain shown in FIG. 6 are the storage elements 116 of signature module 110. When scan mode is enabled, the scan enable signal 308 causes signal 320 what is provided to the scan input (SIN) of the storage elements to be stored in the corresponding storage element. In this manner, each of the storage elements are serially connected to form a portion of the scan chain of the chip 100. The signature value can then be provided as a portion of a scan output signal obtained at an appropriate scan out pin on the chip 100. Alternatively the signature value may be provided to outputs of the chip 100 in parallel, either by use of dedicated pins or by multiplexing the signature value onto pins ordinarily used for another purpose.

It is to be understood that the specific mechanisms and techniques, such as the specific widths and densities of the cells, discussed herein are merely illustrative of one application of the principles of the invention. Numerous modifications may be made to the methods and apparatus described without departing from the true spirit and scope of the invention.

What is claimed is:

1. Apparatus for testing signals transmitted by a first logic block contained within an integrated circuit and received by a second logic block contained within said integrated circuit, comprising:

a multiple input signature module, responsive to a test mode, for capturing data values contained in said signals in response to a valid signal that causes the data values contained in said signals to be used in said second logic block, and for generating a signature value indicative of said data values, said multiple input signature module being further responsive to a data output mode for providing said signature value as an output signal of said integrated circuit; and mask circuitry for masking selected groups of said signals to a predetermined value.

2. Apparatus as set forth in claim 1 wherein said integrated circuit further comprises a scan chain and wherein said data output mode causes said signature module to form a portion of said scan chain, wherein said signature value is provided as a portion of a serial data stream transmitted by said output signal.

3. A method of testing functionality of circuitry embedded within an integrated circuit as a function of signals generated by said circuitry, said signals being internal to said integrated circuit, the method comprising the steps of:

responding to a test mode by capturing data values of said signals generated by said circuitry;

generating a signature value as a function of said captured data values; outputting said signature value to at least a first output pin of said integrated circuit; and comprising the further step of masking at least a first group of said signals to a predetermined value.

4. A method as set forth in claim 3 wherein said outputting step comprises the step of causing said signature value to form a portion of a scan chain.

5. An integrated circuit comprising:

a first circuit module for generating a plurality of digital signals;

a second circuit module for receiving said digital signals;

a multiple input signature module for receiving said digital signals, for compressing values indicative of said data signals to generate a signature value, and for storing said signature value;

control circuitry, responsive to a test signal, for causing said values indicative of said digital signals to be stored to said multiple input signature module, each time said values are received by said second circuit module, said control circuitry being further responsive to a signature data signal for causing said signature value to be provided on at least a first output pin of said integrated circuit; and mask circuitry, responsive to a mask signal, for masking, during a first of said cycles, selected groups of said digital signals to a predetermined value, wherein values for said groups of said digital signals are not generated by said first circuit module for said first of said cycles.

6. An integrated circuit as set forth in claim 5 wherein said second circuit module is a memory that stores data values indicative of certain of said digital signals.

7. An integrated circuit as set forth in claim 6 wherein said memory is a dynamic random access memory.

8. An integrated circuit as set forth in claim 6 wherein said control circuitry comprises:

means, responsive to said test signal, and to a write enable signal which causes data to be written to said memory, for causing said signals to be stored to said multiple input signature module.

9. An integrated circuit as set forth in claim 8 wherein said multiple input signature module comprises:

means, responsive to a reset signal, for causing said multiple input signature module to be initialized to a predetermined value.

10. An integrated circuit as set forth in claim 9 wherein said multiple input signature module comprises a plurality of storage elements for storing said signature value and wherein said means for causing said multiple input signature module to be initialized to a predetermined value comprises a reset input on said storage elements, said reset input responding to said test signal to reset each of said storage elements to a predetermined value.

11. An integrated circuit as set forth in claim 9 wherein said multiple input signature module comprises a plurality of storage elements for storing said signature value and wherein said means for causing said multiple input signature module to be initialized to a predetermined value comprises a logic element, corresponding to each of said storage elements, each of said logic elements coupled to a data input of a corresponding one of said storage elements, each of said logic elements responding to said test signal to cause a predetermined value to be stored in each of said corresponding storage elements.

12. An integrated circuit as set forth in claim 5 further comprising:
  a scan chain, responsive to a scan enable signal to cause data stored in elements of said scan chain to be provided on an output pin of said integrated circuit;
  said control circuitry further comprising means, responsive to said scan enable signal, for causing said signature value to form a portion of said scan chain.

13. An integrated circuit as set forth in claim 5 further comprising means, responsive to a signature value signal, for causing said signature value to be provided, in parallel, to output pins of said integrated circuit.

14. An integrated circuit as set forth in claim 5 wherein said control circuitry is responsive to a reset signal, for causing said multiple input signature module to be initialized to a predetermined value and wherein said control circuitry responds to a diagnostic mode by causing said digital signals to be stored to said multiple input signature module at a predetermined cycle, said control circuitry further responding to said diagnostic mode by causing said digital signals stored in said multiple input signature module to be provided on said first output pin.

* * * * *